(12) United States Patent
Chen et al.

(10) Patent No.: US 10,681,838 B2
(45) Date of Patent: Jun. 9, 2020

(54) ELECTRICAL ENCLOSURE WITH A GREAT HEAT-DISSIPATION AND AN INGRESS PROTECTION RATING EQUAL OR GREATER THAN LEVEL 65

(71) Applicants: Qinghong Chen, Beijing (CN); Dongdong Chen, Beijing (CN)

(72) Inventors: Qinghong Chen, Beijing (CN); Dongdong Chen, Beijing (CN)

( * ) Notice: Subject to any disclaimer, the term of this patent is extended or adjusted under 35 U.S.C. 154(b) by 0 days.

(21) Appl. No.: 16/180,006

(22) Filed: Nov. 5, 2018

(65) Prior Publication Data
US 2019/0082557 A1   Mar. 14, 2019

(30) Foreign Application Priority Data
Sep. 5, 2017 (CN) .................... 2017 2 1130788 U

(51) Int. Cl.
| H05K 7/00 | (2006.01) |
| H05K 7/20 | (2006.01) |
| H05K 5/02 | (2006.01) |
| H02B 1/28 | (2006.01) |
| H02B 1/56 | (2006.01) |

(52) U.S. Cl.
CPC ..... *H05K 7/20154* (2013.01); *H05K 7/20209* (2013.01); *H05K 7/20409* (2013.01); *H05K 7/20445* (2013.01); *H02B 1/28* (2013.01); *H02B 1/56* (2013.01); *H05K 5/0213* (2013.01)

(58) Field of Classification Search
CPC . H05K 7/20136; H05K 7/2039–20418; H05K 7/20472–20481
USPC .......... 361/695–697, 701–705, 714
See application file for complete search history.

(56) References Cited

U.S. PATENT DOCUMENTS

| 7,816,631 B2* | 10/2010 | Cramer ............. H05K 7/20918 219/632 |
| 9,374,932 B2* | 6/2016 | Hwang ................ F28F 13/003 |
| 2004/0204527 A1* | 10/2004 | Chien .................... C09J 109/02 524/404 |
| 2005/0228097 A1* | 10/2005 | Zhong .................... B82Y 30/00 524/430 |
| 2006/0005549 A1* | 1/2006 | Ishinabe ................ F25B 21/02 62/3.2 |
| 2006/0274493 A1* | 12/2006 | Richardson ........... G06F 1/1626 361/679.4 |

(Continued)

*Primary Examiner* — William H. Mayo, III
(74) *Attorney, Agent, or Firm* — Bayramoglu Law Offices LLC

(57) ABSTRACT

An electrical enclosure with a great heat dissipation and an ingress protection rating equal or greater than level 65, including a sealed enclosure housing and a heat bridge configured inside the sealed enclosure housing. The sealed enclosure housing includes a heat-absorbing layer, a reinforced layer and a heat dissipating layer. The heat bridge can be a gaseous heat bridge or a solid heat bridge. One end of the heat bridge is connected to the heat-emitting electrical components configured inside the sealed enclosure, and the other end is connected to the heat-absorbing layer on the sealed enclosure housing. The generated heat is rapidly conducted to the heat-absorbing layer on the enclosure housing through the heat bridge, and then conducted to the heat dissipation layer through the reinforced layer. The heat is dissipated to the exterior space through such structure to keep a suitable temperature inside the sealed enclosure.

8 Claims, 4 Drawing Sheets

(56) References Cited

U.S. PATENT DOCUMENTS

| | | | | |
|---|---|---|---|---|
| 2008/0141681 A1* | 6/2008 | Arnold | ............... | A41D 13/005 62/3.5 |
| 2010/0171889 A1* | 7/2010 | Pantel | ............... | G02F 1/133308 349/1 |
| 2011/0203770 A1* | 8/2011 | Rowe | ............... | H05K 7/202 165/80.1 |
| 2012/0038175 A1* | 2/2012 | Tang | ............... | H01L 23/38 290/1 R |
| 2012/0050989 A1* | 3/2012 | Bhagavat | ............... | H01L 23/467 361/694 |
| 2013/0189467 A1* | 7/2013 | Cai | ............... | C09J 183/04 428/40.4 |
| 2014/0015106 A1* | 1/2014 | Hsieh | ............... | H01L 23/562 257/618 |
| 2014/0092562 A1* | 4/2014 | Xu | ............... | H01L 23/36 361/720 |
| 2014/0260397 A1* | 9/2014 | Agnaou | ............... | H02B 1/565 62/259.2 |
| 2015/0118482 A1* | 4/2015 | Kagawa | ............... | B32B 27/08 428/323 |
| 2015/0124381 A1* | 5/2015 | Wu | ............... | H02B 1/56 361/678 |
| 2015/0351282 A1* | 12/2015 | Fujiwara | ............... | H05K 7/2099 361/696 |
| 2017/0294693 A1* | 10/2017 | Tong | ............... | H01M 10/653 |
| 2017/0347493 A1* | 11/2017 | Arai | ............... | H05K 7/20481 |
| 2018/0192547 A1* | 7/2018 | Nishio | ............... | B32B 7/02 |
| 2018/0206324 A1* | 7/2018 | Hayakawa | ............... | H01L 23/12 |
| 2018/0376618 A1* | 12/2018 | Park | ............... | H05K 7/20481 |
| 2019/0011760 A1* | 1/2019 | Wang | ............... | G02F 1/133 |

* cited by examiner

ELECTRICAL ENCLOSURE WITH A GREAT HEAT-DISSIPATION AND AN INGRESS PROTECTION RATING EQUAL OR GREATER THAN LEVEL 65

CROSS REFERENCE TO RELATED APPLICATIONS

This application is based upon and claims priority to Chinese Patent Application No. CN201721130788.3, filed on Sep. 5, 2017, the entire contents of which are incorporated herein by reference.

TECHNICAL FIELD

The present invention relates to the field of electrical enclosures, and in particular to an electrical enclosure with a great heat dissipation and an ingress protection rating equal or greater than level 65.

BACKGROUND

Regarding various electrical enclosures for industrial or civil use, the electrical components configured therein will get heated up at work. If such heat fails to be dissipated in time, the temperature will rise, and therefore the service life and stability of the electrical components will be adversely affected. Even worse, failures will be caused and hazards will occur. Consequently, methods such as air cooling, and water cooling are generally used in the electrical enclosure to dissipate heat and reduce temperature, so as to avoid excessive temperature of the heated components in the enclosure. With respect to the traditional method of air cooling, the enclosure is required to be provided with various openings. In doing so, the airtightness of the enclosure is damaged, and the actual ingress protection rating cannot meet the requirements of dustproof and waterproof during use.

Meanwhile, with low-level ingress protection rating, the performance of electrical components would be affected, thereby causing issues such as: reduced reliability, shortened service life, increased maintenance costs, increased manufacturing costs and so on. Especially, in relatively harsh contexts, such as the sandy, windy, and dusty areas and the areas near water, due to the poor airtightness of the traditional electrical enclosures, the disadvantages such as reduced performance and stability, shortened service life, and increased cost etc. will become more outstanding in such contexts. Therefore, the requirements of waterproof and dustproof of the enclosure are important.

When the traditional heat dissipation method of air cooling cannot be adopted due to the airtightness requirement, the electrical components in the sealed enclosure only can dissipate heat through air conduction which is very slow, because the thermal conductivity of the air at room temperature is only 0.026 W/m*K. Although the thermal conductivity can reach 5~20 W/m2*K during the air convection and heat exchange, the interior space of the sealed enclosure is unable to provide a sufficient space for the air convection and heat dissipation, and there is a high thermal resistance coefficient, so that the temperature of the whole interior of the enclosure will rise in short time. With an excessive temperature inside the sealed enclosure, the use will be affected.

SUMMARY

(1) Technical Problems to be Solved

In order to solve the above-mentioned problems of the prior art, the present invention provides an enclosure which is sealable and has an ingress protection rating equal or greater than level 65. Meanwhile, the enclosure has a great heat dissipation.

(2) Technical Solution

In order to achieve the above objectives, the present invention provides an electrical enclosure with a great heat dissipation and an ingress protection rating equal or greater than level 65, characterized in that the electrical enclosure includes: a sealed enclosure housing and a heat bridge configured inside the sealed enclosure housing.

The sealed enclosure housing includes a heat-absorbing layer, a reinforced layer, and a heat dissipation layer. The heat-absorbing layer receives heat conducted by the heat bridge. The reinforced layer ensures a mechanical structure strength of the sealed enclosure housing and conducts the heat received by the heat-absorbing layer to the heat dissipation layer. The heat dissipation layer dissipates the heat to an exterior of the sealed enclosure housing.

The heat bridge at least partially contacts the heat-absorbing layer for conducting the heat dissipated from an electrical component configured inside the sealed enclosure housing to the heat-absorbing layer.

Further, the heat dissipation layer and/or the heat-absorbing layer include a material with a negative thermal resistance effect.

Further, the heat bridge includes a gaseous heat bridge and/or a solid heat bridge.

Further, the gaseous heat bridge is a gas inside the sealed enclosure housing. The gas is driven by a fan, and flows compulsively from the electrical component to the heat-absorbing layer, and flows back from the surrounding. The heat-absorbing layer is formed by a material with a negative thermal resistance effect.

Further, the solid heat bridge includes an aluminum plate and a thermal adhesive with electrical insulation and elasticity. The aluminum plate is connected to the sealed enclosure housing and/or the electrical component through the thermal adhesive.

Further, the heat dissipation layer includes heat dissipation fins configured on an outer surface of the enclosure housing.

Further, the heat dissipation layer includes a cooling fan configured outside the enclosure housing with a motor having an ingress protection rating reaching the ingress protection rating of the corresponding sealed enclosure housing.

(3) Advantages

The present invention includes a sealed enclosure housing and a heat bridge configured inside the sealed enclosure housing. The ingress protection rating of the sealed enclosure housing can equal or greater than level 65, so that it has a stronger protection for the electrical components inside the enclosure. Also, the service life can be increased, the manufacturing costs and the maintenance costs are reduced.

The heat bridge and the heat dissipation layer can conduct the heat from the heat-emitting body under a sealed condition, thereby reducing the temperature of the working area and protecting the electrical components. The insulating thermal adhesive performs insulation while conducting heat, so it can avoid the potential safety hazard of directly contacting the electrical components.

The outer side of the heat-dissipation enclosure is mounted with fins and fans and coated with a material having negative thermal resistance effect, so the heat dissipation efficiency is effectively improved.

The present invention has an ingress protection rating equal or greater than level 65, as well as a great heat dissipation effect.

DESCRIPTION OF REFERENCE NUMERALS

Figure 1:
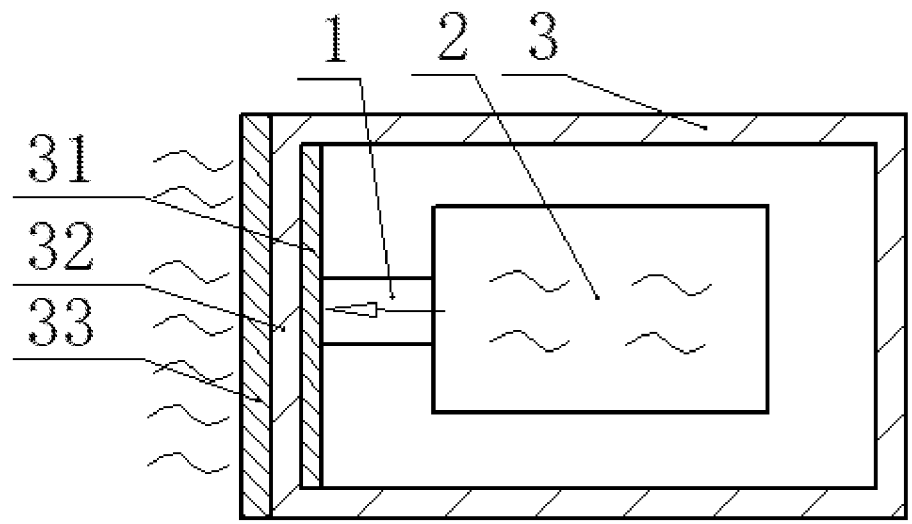
FIG. 1 is a structural schematic diagram of an electrical enclosure with a great heat dissipation function and an ingress protection rating equal or greater than level 65.

1: heat bridge;
11: aluminum plate
12: thermal adhesive
2: heat-emitting electrical component;
3: sealed enclosure housing;
31: heat-absorbing layer; 32: reinforced layer; and
33: heat dissipation layer.
311: heat dissipation fin
4: fan
5: cooling fan
6: motor

DETAILED DESCRIPTION OF THE EMBODIMENTS

For a better description and a better understanding of the present invention, the present invention will be described in detail hereinafter through specific embodiments with reference to the drawings.

Figure 2:
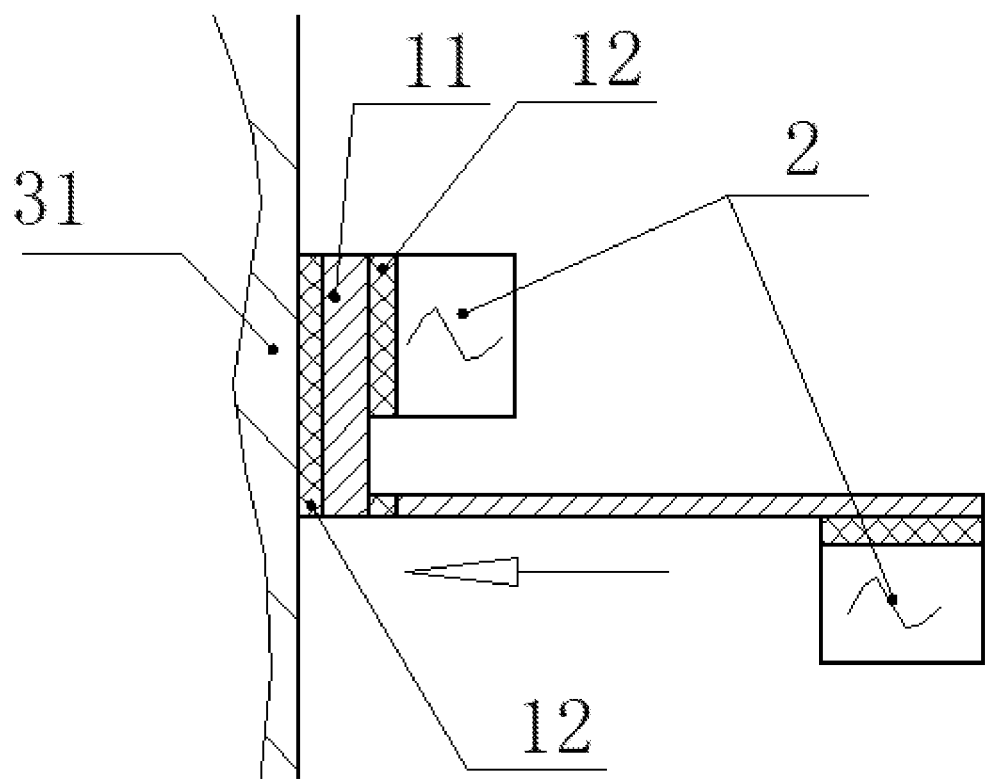
FIG. 2 is a structural schematic diagram of a solid heat bridge.
Figure 3:
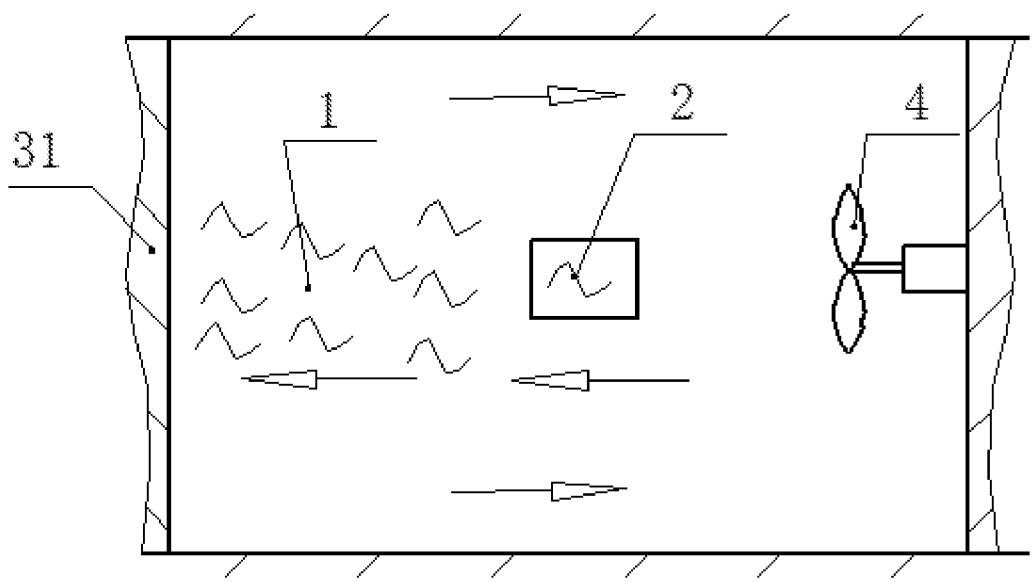
FIG. 3 is a structural schematic diagram of a gaseous heat bridge.

FIGS. 1 to 3 shows an electrical enclosure with a great heat dissipation and an ingress protection rating equal or greater than level 65 which is used to protect the electrical components 2 configured inside the sealed enclosure housing 3 and provide the function of heat dissipation.

Housing:

As shown in FIG. 1, the sealed enclosure housing 3 includes a three-layer structure. The innermost layer is a heat-absorbing layer 31. The outermost layer is a heat dissipation layer 33. The intermediate layer is a reinforced layer 32. The reinforced layer 32 ensures the mechanical structure strength of the sealed enclosure housing 3 and ensures that the ingress protection rating of sealing is at level 65. The heat absorbing-layer 31 and the heat dissipation layer 33 achieve a great heat dissipation function of the housing together with other heat dissipation structures.

The heat dissipation layer 33 and the heat-absorbing layer 31 cover the outer surface and the inner surface of the whole sealed housing 3. The reinforced layer 32 suitable for the heat conduction is configured between the heat-absorbing layer 31 and the heat dissipation layer 33. The whole heat-absorbing layer 31 can absorb heat in the interior space of the sealed enclosure housing 3 in all directions.

Optionally, the heat-absorbing layer 31 and the heat dissipation layer 33 are merely configured on the top surface of the sealed enclosure housing 3. The advantages of doing so are as follows. Since, except for the forced flowing, the heated air inside the sealed enclosure has a tendency of upward convection under the natural condition, with this arrangement, the heat can be preferably dissipated outside through the heat dissipation layer 33 configured on the top.

In a word, there is no need to provide the heat-absorbing layer 31 and the heat dissipation layer 33 on the whole surface of the housing. The heat absorbing layer 31 and the heat dissipation layer 33 can be partially and correspondingly configured on both the inner and outer sides of the reinforced layer 32, namely, a partial area of the housing includes the three-layer structure, and other areas that do not perform the function of heat dissipation are merely configured with the reinforced layer, as long as the heat dissipation requirements of the electrical components can be satisfied. It can be understood that the larger the area of the three-layer structure, i.e., the larger the area of the housing involved in the heat conduction and heat dissipation, the faster the external environment can take away the heat.

Preferably, the heat absorbing layer 31 is formed by a material having a negative heat resistance effect. The material having the negative heat resistance effect can be the coating with negative heat resistance effect available in the market, such as the negative heat resistance coating produced by HAIJIALI, Beijing. The material with negative thermal resistance effect can reduce the thermal resistance coefficient and increase the rate of heat dissipation to the exterior of the enclosure.

Preferably, the reinforced layer 32 is formed by the galvanized iron plate and partially formed by the glass fiber reinforced plastic. It should be noted that the portion of the reinforced layer located between the heat-absorbing layer 31 and the heat dissipation layer 33 is preferably formed by the galvanized iron plate to provide a great heat conduction from the heat-absorbing layer 31 to the heat dissipation layer 33.

Figure 5:
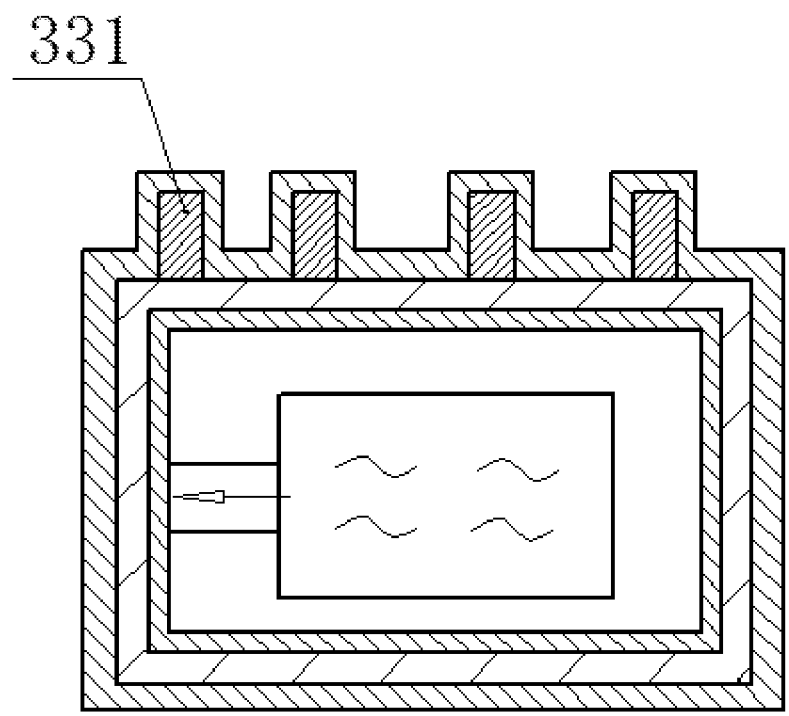
FIG. 5 is a structural schematic diagram of an electrical enclosure with heat dissipation fins, a great heat dissipation and an ingress protection rating equal or greater than level 65.

The heat dissipation layer 33 may also be formed by the material with negative heat resistance effect, or it may include heat dissipation fins 311 faced toward the exterior of the enclosure, as shown in FIG. 5. The heat dissipation fins 331 are made of aluminum alloy. Preferably, the heat dissipation fins 331 extend in a direction perpendicular to the surface of the housing to facilitate convection of the outside air and to better dissipate heat to the exterior space. Preferably, the heat dissipation fins 311 are integrally formed with the reinforced layer 32 of the corresponding surface of the sealed enclosure housing 3. Further, the surfaces of the heat dissipation fins 311 are also coated with the material with negative thermal resistance effect.

Figure 4:
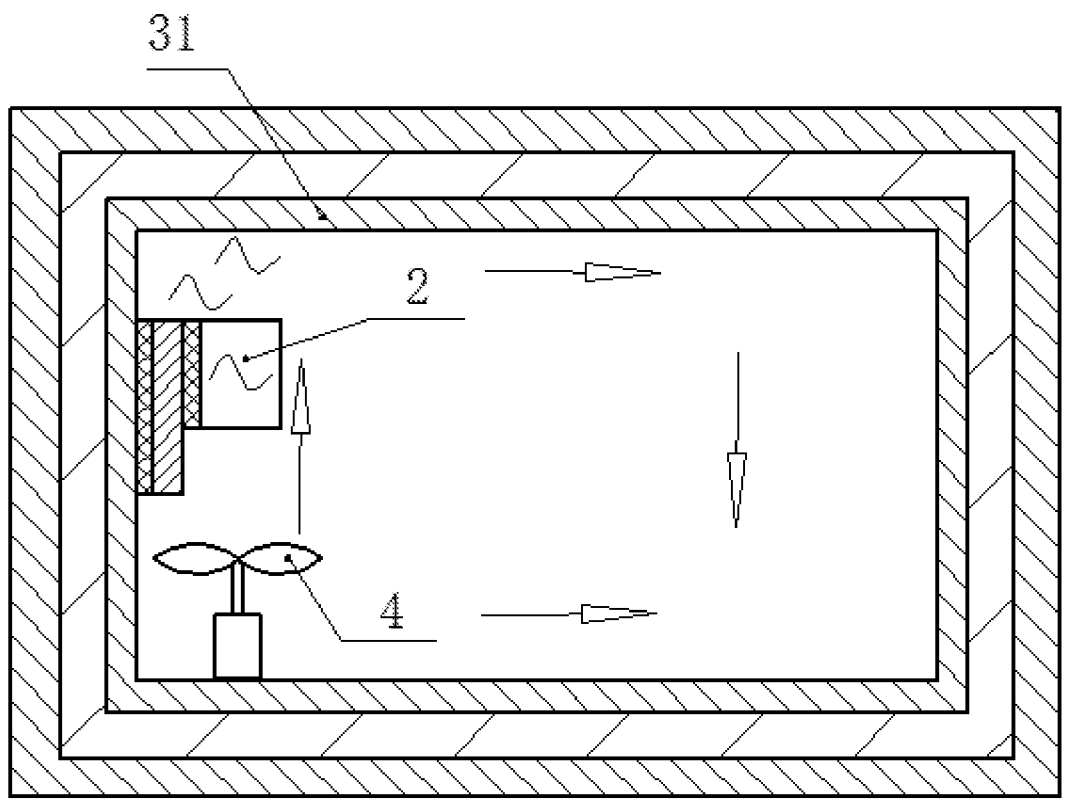
FIG. 4 is a structural schematic diagram of a combination of a gaseous heat bridge and a solid heat bridge.

Heat Bridge:

As shown in FIG. 4, the electric components 2 inside the sealed enclosure housing 3 are connected to the heat-absorbing layer 31 by a heat bridge 1. The heat generated by the electrical components 2 is conducted to the heat absorbing layer 31 on the sealed enclosure housing 3 by the heat bridge 1, and then the heat is dissipated to the exterior space of the sealed enclosure through the reinforced layer 32 and the heat dissipation layer 33. The air of the exterior space flows freely or compulsively (installing a cooling fan 5) to take away the heat dissipated from the heat dissipation layer 33.

The heat bridge 1 may include a solid heat bridge and/or a gaseous heat bridge. The solid heat bridge and the gaseous heat bridge can be used alone or in combination.

As shown in FIG. 2, the solid heat bridge includes an aluminum plate 11 and a thermal adhesive 12. The aluminum plate 11 is entirely adhered to the heat-absorbing layer 31 by means of the thermal adhesive 12. The electrical components 2 are adhered to the aluminum plate 11 by means of the thermal adhesive 12. The thermal adhesive 12 is filled between the opposite sides of the electrical components and the aluminum plate 11. Preferably, the aluminum plate may be a 6063 aluminum alloy with a thermal conductivity of about 200 W/m*K. The electrical components inside the sealed enclosure are mounted on the aluminum plate 11. The contact surface of the electrical components 2 and the aluminum plate 11 is coated with the thermal adhesive 12. The thermal adhesive 12 may be a thermally conductive silicone.

The heat generated by the electrical component 2 is conducted to the aluminum plate 11 through the electrically insulated thermal adhesive 12, then conducted from the aluminum plate 11 to the heat-absorbing layer 31, and finally dissipated to the exterior space of the sealed enclosure through the reinforced layer 32 and the heat dissipation layer 33.

The aluminum plate 11 may be further optimized to include two aluminum plates connected to each other. The first aluminum plate is configured to be attached with the heat-absorbing layer 31. The attaching surface is coated with the electrically insulated thermal adhesive. The electrical element 2 is configured on the surface of the second aluminum plate. The second aluminum plate is connected to the electrical component 2 by means of the electrically insulated thermal adhesive.

Further, a plurality of second aluminum plates are respectively connected to the electrical components 2 configured at different positions inside the sealed enclosure housing 3. The other ends of the plurality of second aluminum plates are connected to the first aluminum plates. The attaching surfaces on two ends of each second aluminum plate are coated with the electrically insulated thermally conductive silicone. The sizes of the plurality of second aluminum plates may also be individually calculated according to the heat emitting of the corresponding electrical components.

In this case, the electrical components 2 can be arranged more flexibly in the sealed enclosure housing 3. The heat generated by the electrical component 2 is conducted to the corresponding second aluminum plate through the thermal adhesive, then conducted to the first aluminum plate through the thermal adhesive, and next conducted to the heat-absorbing layer 31. The heat is subsequently dissipated to the exterior space of the sealed enclosure housing 3 through the reinforced layer 32 and the heat dissipation layer 33, thereby keeping a suitable temperature for the interior space.

As shown in FIG. 3, the gaseous heat bridge is formed by the gas inside the sealed enclosure housing 3. The gas flow compulsively under the action of the fan 4. The gas flows along a path from the electrical component 2 to the heat-absorbing layer 31 of the three-layer heat dissipation structure, and then flows back from the surroundings. The motor part of the fan 4 has small heat dissipation fins so that the heat generated by the operation of the motor 6 is rapidly dissipated and conducted to the housing via the gaseous heat bridge. The heat generated by the electrical component 2 is carried by the gaseous heat bridge, transmitted to the heat absorbing layer 31, and then dissipated to the exterior space through the reinforced layer 32 and the heat dissipation layer 33.

Other Heat Dissipation Designs

Figure 6:
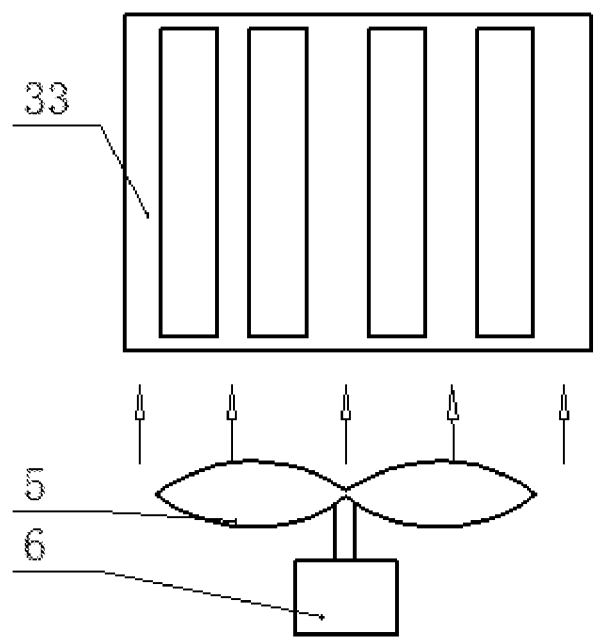
FIG. 6 is a top plan view of a heat dissipation layer with heat dissipation fins and a cooling fan.
Figure 7:
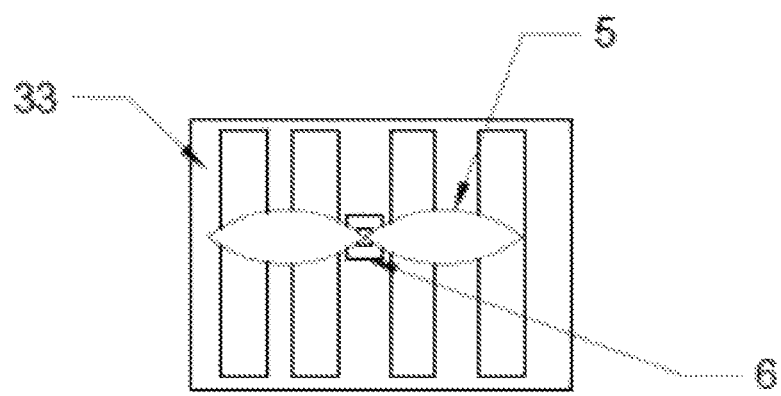
FIG. 7 is a top plan view of a heat dissipation layer with heat dissipation fins and a cooling fan where the cooling fan is configured to the above of the heat dissipation fins.

Preferably, a cooling fan 5 is arranged on the corresponding outer side of the heat dissipation layer 33, as shown in FIG. 6. When the heat dissipation fins 311 and the cooling fan 5 are arranged at the same time, the wind flows along the direction of the heat dissipation fins 311. Further, when the heat dissipation fins 311 are arranged on the side, the heat dissipation fins 311 are arranged horizontally, and the wind flows laterally. When the heat dissipation fins 311 are arranged on the top surface, the cooling fan 5 may be arranged along the direction of the heat dissipation fins, or configured as an extractor fan parallel above of the fins as shown in FIG. 7.

Further, the ingress protection rating of the motor 6 of the cooling fan 5 can reach level 65. Further, the cooling fan 5 is provided with a rainproof device.

The above-mentioned embodiments are merely preferred embodiments of the present invention. For, those skilled in the art, various variations on the specific embodiments and application scope may derived according to the idea of the present invention. The specification should not be interpreted as the limits of the present invention.

The invention claimed is:

1. An electrical enclosure with heat dissipation and an ingress protection rating equal or greater than level 65 comprising:
    a sealed enclosure housing and a heat bridge, wherein the sealed enclosure housing has the ingress protection rating equal or greater than level 65;
    wherein
    the heat bridge is solely located inside the sealed enclosure housing and comprises a first plate and a second plate, wherein one end of the second plate is attached to the first plate;
    a first electrical component is attached to a surface of the first plate and a second electrical component is attached to a surface of the second plate;
    a fan driving a gas to cool the first electrical component and the second electrical component;
    the sealed enclosure housing comprises a heat-absorbing layer, a reinforced layer, and a heat dissipation layer;
    the heat-absorbing layer receives heat conducted by the heat bridge, the reinforced layer ensures a mechanical structure strength of the sealed enclosure housing and conducts the heat received by the heat-absorbing layer to the heat dissipation layer, the heat dissipation layer dissipates the heat to an exterior of the sealed enclosure housing; and
    the heat bridge thermally contacts the heat-absorbing layer for conducting the heat dissipated from the first electrical component and the second electrical component.

2. The electrical enclosure according to claim 1, wherein the heat dissipation layer or the heat-absorbing layer comprise a material having a negative thermal resistance effect.

3. The electrical enclosure according to claim 1, wherein the heat bridge comprises a solid heat bridge or a gaseous heat bridge and a solid heat bridge.

4. The electrical enclosure according to claim 3, wherein
the gaseous heat bridge is the gas inside the sealed enclosure housing;
the gas is driven by the fan, flows compulsively from the first electrical component and the second electrical component to the heat-absorbing layer, and flows circularly in the sealed enclosure housing; and
the heat-absorbing layer is formed by a material having a negative thermal resistance effect.

5. The electrical enclosure according to claim 3, wherein the solid heat bridge further comprises the first plate and the second plate being aluminum and a thermal adhesive with electrical insulation and elasticity;
wherein, the aluminum first plate and the aluminum second plate are connected to the sealed enclosure housing and to the first electrical component and the second electrical component through the thermal adhesive, wherein, the thermal adhesive is a thermally conductive silicone.

6. The electrical enclosure according to claim 1, wherein the heat dissipation layer comprises a plurality of heat dissipation fins; the plurality of heat dissipation fins is configured on an outer surface of the sealed enclosure housing, wherein the plurality of heat dissipation fins is coated with a material with negative thermal resistance effect.

7. The electrical enclosure according to claim 1, wherein the heat dissipation layer comprises a cooling fan; the cooling fan is configured outside the sealed enclosure housing, wherein, the cooling fan has two different configurations, wherein first of the configurations is arranging along the direction of the plurality of heat dissipation fins, wherein the second of the configurations is configuring as an extractor fan parallel above the plurality of heat dissipation fins, wherein the cooling fan is provided with a rainproof device; and a motor of the cooling fan has an ingress protection rating reaching an ingress protection rating of the sealed enclosure housing.

8. The electrical enclosure according to claim 1, wherein the attachment of the one end of the second plate is perpendicular to the first plate.

* * * * *